United States Patent
Sauer (10) Patent No.: US 9,685,425 B2
(45) Date of Patent: Jun. 20, 2017

(54) INTEGRATED CIRCUIT PACKAGE

(71) Applicant: Apple Inc., Cupertino, CA (US)

(72) Inventor: Matthias Sauer, San Jose, CA (US)

(73) Assignee: Apple Inc., Cupertino, CA (US)

( * ) Notice: Subject to any disclaimer, the term of this patent is extended or adjusted under 35 U.S.C. 154(b) by 223 days.

(21) Appl. No.: 14/165,982

(22) Filed: Jan. 28, 2014

(65) Prior Publication Data

US 2015/0216053 A1    Jul. 30, 2015

(51) Int. Cl.
*H05K 7/00* (2006.01)
*H01L 25/065* (2006.01)
*H05K 1/14* (2006.01)
*H01L 23/31* (2006.01)
*H05K 1/18* (2006.01)
*H05K 3/28* (2006.01)

(52) U.S. Cl.
CPC ...... *H01L 25/0657* (2013.01); *H01L 23/3128* (2013.01); *H05K 1/141* (2013.01); *H01L 2224/16225* (2013.01); *H01L 2224/48091* (2013.01); *H01L 2224/48227* (2013.01); *H01L 2225/0651* (2013.01); *H01L 2225/06517* (2013.01); *H01L 2225/06568* (2013.01); *H01L 2924/0002* (2013.01); *H01L 2924/15192* (2013.01); *H01L 2924/19106* (2013.01); *H05K 1/182* (2013.01); *H05K 3/284* (2013.01); *H05K 2201/09063* (2013.01); *H05K 2203/1316* (2013.01)

(58) Field of Classification Search
CPC ........ H05K 1/141–1/144; H05K 3/305; H01L 25/105; H01L 25/0657; H01L 2924/30107; H01L 2924/01079

USPC ......... 361/770–790; 257/685–686, 723–730, 257/780–790

See application file for complete search history.

(56) References Cited

U.S. PATENT DOCUMENTS 5,854,507 A * 12/1998 Miremadi ............. H01L 25/105
257/685
6,515,356 B1 * 2/2003 Shin ........................ H01L 21/56
257/678

(Continued)

OTHER PUBLICATIONS

"Package on Package (PoP) Family", Data Sheet, Amkor Technology, Dec. 2012, Chandler, Arizona [Retrieved on Jun. 17, 2014] Retrieved from the internet: <URL: http://www.amkor.com>.

(Continued)

*Primary Examiner* — Tuan T Dinh
(74) *Attorney, Agent, or Firm* — Treyz Law Group, P.C.; G. Victor Treyz; Zachary D. Hadd (57) ABSTRACT

An integrated circuit package may have a package substrate with a surface to which an integrated circuit die is soldered. A first set of contacts on the package substrate may mate with contacts on the integrated circuit die. Solder may be used to connect the integrated circuit die to the first set of contacts. A covering material such as a plastic mold cap may be used to cover the integrated circuit die and the first set of contacts. The mold cap may have a rectangular shape or other footprint. A rectangular ring-shaped border region or a border region of other shapes may surround the mold cap and may be free of mold cap material. A second set of contacts on the package substrate may be formed on the surface in the border region.

21 Claims, 9 Drawing Sheets

(56) References Cited

U.S. PATENT DOCUMENTS

| | | | | |
|---|---|---|---|---|
| 6,768,208 B2* | 7/2004 | Lin | ............... | H01L 25/0657 257/673 |
| 7,402,901 B2* | 7/2008 | Hatano | ............... | H01L 23/5389 257/684 |
| 7,522,886 B2* | 4/2009 | Koh | ............... | H05K 1/0218 361/718 |
| 7,554,185 B2* | 6/2009 | Foong | ............... | H01L 25/0652 257/686 |
| 7,871,862 B2 | 1/2011 | Chow et al. | | |
| 7,915,724 B2* | 3/2011 | Ha | ............... | H01L 23/3121 257/686 |
| 7,929,320 B2* | 4/2011 | Mashino | ............... | H05K 1/0219 361/800 |
| 8,034,660 B2* | 10/2011 | Takahashi | ............... | H01L 21/561 438/108 |
| 8,207,607 B2* | 6/2012 | Yamagishi | ............... | H01L 23/315 257/680 |
| 8,258,614 B2* | 9/2012 | Camacho | ............... | H01L 21/561 257/684 |
| 8,370,777 B2 | 2/2013 | Hawk, Jr. et al. | | |
| 2003/0027530 A1* | 2/2003 | Levitt | ............... | H01P 1/2138 455/73 |
| 2008/0315406 A1* | 12/2008 | Chung | ............... | H01L 24/83 257/723 |
| 2011/0062599 A1 | 3/2011 | Kim et al. | | |
| 2012/0256305 A1 | 10/2012 | Kaufmann et al. | | |
| 2013/0181360 A1 | 7/2013 | Kim et al. | | |

OTHER PUBLICATIONS

P. Markondeya Raj et al., "3D Integrated Passive and Active Components (3D IPAC): A New Concept for the Ultra-Miniaturized Integration of Passive and Active Components", Chip Scale Review Magazine: Tech Monthly, Nov.-Dec. 2013, 5 pages. [Retrieved on Jan. 8, 2014] Retrieved from the Internet: <URL: http://www.chipscalereview.com/issues/1113/content/CSR_November-December-2013_digital.pdf>.

* cited by examiner

INTEGRATED CIRCUIT PACKAGE

BACKGROUND

This relates generally to integrated circuits and, more particularly, to integrated circuit packages and ways for mounting integrated circuit packages to printed circuit boards.

Electronic devices such as computers and handheld electronic devices are often provided with packaged integrated circuits mounted to printed circuit boards. In a typical scenario, an integrated circuit is packaged by flip-chip mounting an integrated circuit die to the surface of a package substrate. An additional die may be placed on top of the die and wire bonded to pads on the package substrate. A plastic mold cap covers the die and the additional die and exposed portions of the surface of the package substrate to form a integrated circuit package. Solder pads on the lower surface of the package substrate are used in mounting the integrated circuit package to the surface of a printed circuit board.

Conventional packaging and mounting arrangements such as these may consume more space within a device than desired. For example, the total thickness of the printed circuit board and packaged integrated circuit may be larger that desired.

It would therefore be desirable to be able to provide improved integrated circuit packaging and mounting arrangements.

SUMMARY

Integrated circuits may be packaged in integrated circuit packages. An integrated circuit package may have a package substrate formed from printed circuit board material. The package substrate may have a surface to which an integrated circuit die is soldered. One or more additional integrated circuit dies may be stacked above the integrated circuit die or mounted laterally adjacent to the integrated circuit die.

A first set of contacts on the package substrate may mate with contacts on the integrated circuit die. Solder may be used to connect contacts on the integrated circuit die to the first set of contacts. A covering material such as a plastic mold cap may be used to cover the integrated circuit die and the first set of contacts. The mold cap may have a rectangular outline or other footprint. A rectangular ring-shaped border region or a border region of other shapes may surround the mold cap and may be free of covering material. A second set of contacts on the package substrate may be formed on the surface of the package substrate in the border region.

The integrated circuit package may be mounted on a printed circuit board. The printed circuit board may have an opening that is configured to receive the mold cap. The printed circuit board may have printed circuit contacts. The integrated circuit package may be mounted to the printed circuit so that the surface of the package substrate faces the printed circuit board and so that the mold cap protrudes into the opening. Solder may be used to solder the second set of contacts on the package substrate to the printed circuit contacts.

DETAILED DESCRIPTION

Electronic devices may be provided with electrical components. The electrical components may include integrated circuits, switches, connectors, sensors, light-emitting diodes, audio components, and other circuits. Electrical components such as these may include semiconductor dies mounted within semiconductor packages. For example, one or more integrated circuit dies may be packaged within an integrated circuit package.

Electrical components such as integrated circuit packages (i.e., packaged integrated circuit dies) may be mounted to substrates within an electronic device. The substrates may include printed circuits boards and other dielectric support structures. Printed circuit boards with mounted components such as packaged integrated circuits may be housed in the housing of an electronic device.

Figure 1:
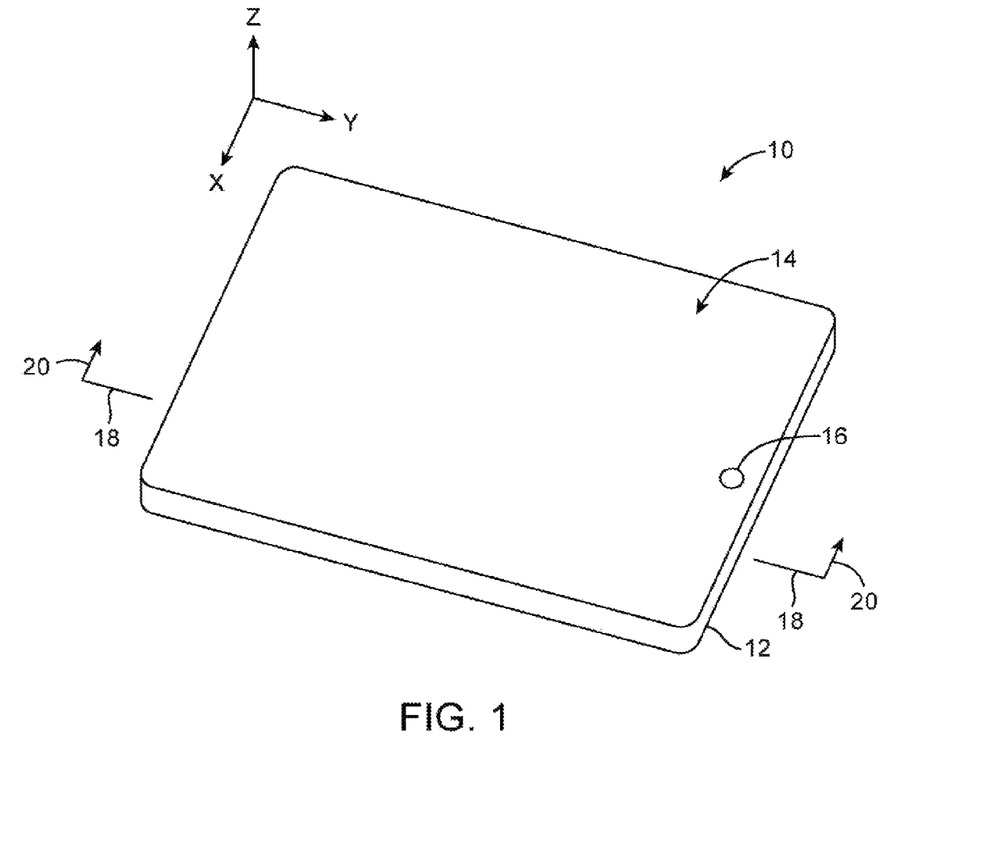
FIG. 1 is a perspective view of an illustrative electronic device of the type that may be provided with packaged integrated circuits and printed circuit boards in accordance with an embodiment.

A perspective view of an illustrative electronic device of the type that may contain one or more printed circuits with mounted electrical components is shown in FIG. 1. Electronic devices such as illustrative electronic device 10 of FIG. 1 may be laptop computers, tablet computers, cellular telephones, media players, other handheld and portable electronic devices, smaller devices such as wrist-watch devices, pendant devices, headphone and earpiece devices, other wearable and miniature devices, or other electronic equipment.

As shown in FIG. 1, device 10 includes housing 12. Housing 12, which is sometimes referred to as a case, may be formed of materials such as plastic, glass, ceramics, carbon-fiber composites and other composites, metal, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may, if desired, have a display such as display 14. Display 14 may, for example, be a touch screen that incorporates capacitive touch electrodes or other touch sensor structures. Display 14 may include image pixels formed from light-emitting diodes (LEDs), organic LEDs (OLEDs), plasma cells, liquid crystal display (LCD) components, or other suitable image pixel structures. A cover layer such as a cover glass member may cover the surface of display 14. Buttons such as button 16 may pass through openings in the cover glass. Openings may also be formed in the cover glass of display 14 or in housing 12 to form a speaker port, openings for connector input-output ports, a microphone port, button openings, etc.

Figure 2:
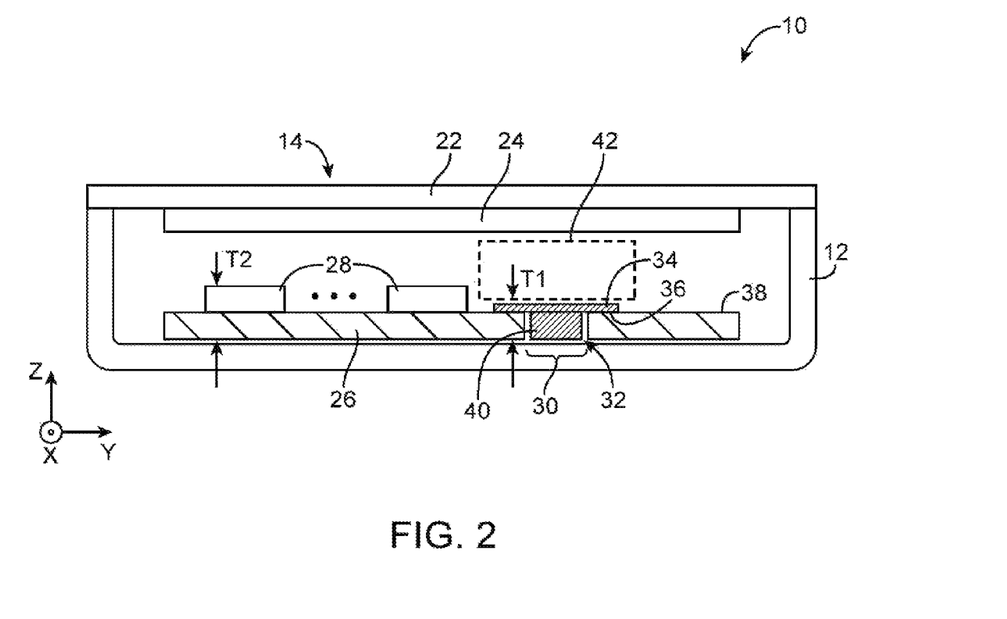
FIG. 2 is a cross-sectional side view of the electronic device of FIG. 1 in accordance with an embodiment.

A cross-sectional side view of device 10 taken along line 18 and viewed in direction 20 of FIG. 1 is shown in FIG. 2. As shown in FIG. 2, display 14 may include display module 24 and display cover layer 22. Display module 24 may include one or more display layers such as liquid crystal display layers, organic light-emitting display layers, or display structures associated with displays using other types of display technology. A touch sensor such as a capacitive touch sensor may, if desired, be incorporated into display 14.

Display 14 may be mounted in housing 12 (e.g., display 14 may be mounted on the front face of device 10). Internal components such as electrical components 28 may be mounted on one or more substrates within housing 12 such as substrate 26. Electrical components 28 may include integrated circuits and other electronic devices. Solder, conductive adhesive, and other attachment mechanisms may be used to mount electrical components 28 to substrate 26.

Substrate 26 may be a rigid printed circuit board (e.g., a printed circuit board formed from fiberglass-filled epoxy or other rigid printed circuit board material) or a flexible printed circuit (e.g., a printed circuit formed from a sheet of polyimide or a layer of other flexible polymer). Substrate 26 may be a printed circuit having one layer of dielectric, two layers of dielectric, three layers of dielectric, or four or more layers of dielectric. One or more layers of metal traces may be used to form interconnect pathways (e.g., vias, contact pads, signal lines, etc.) in a printed circuit (i.e., within the layers of dielectric). If desired, substrate 26 may be formed from a plastic carrier structure (e.g., a molded thermoplastic carrier), a ceramic layer, a glass layer, or other dielectric support structure. Configurations in which substrate 26 is a printed circuit such as a rigid printed circuit board are sometimes described herein as an example. This is, however, merely illustrative. Substrate 26 may be formed from any suitable substrate material.

As shown in FIG. 2, a substrate such as printed circuit board 26 may have one or more openings such as opening (hole) 30. Integrated circuit package 32, which may sometimes be referred to as an electrical device package or component package, may be mounted on printed circuit 26 so that part of integrated circuit package 32 extends into opening 30. Integrated circuit package 32 may contain one or more integrated circuit dies. The dies may be mounted to package substrate 34. Package substrate 34 may be formed from printed circuit board material (i.e., package substrate 34 may be a piece of printed circuit board). The protruding portion of integrated circuit package 32 may be formed form a covering material that covers the die(s) mounted to package substrate 34. The covering material may sometimes be referred to as a mold cap. Mold cap 40 of FIG. 2 may be formed from a dielectric such as plastic and may be molded over the die that have been mounted to package substrate 34.

Contacts (solder pads) are formed on the surface of package substrate 34 that faces printed circuit 26 (i.e., surface 36 of package substrate 34). These contacts are used to solder integrated circuit package 32 to mating contacts (solder pads) on surface 38 of printed circuit 26. Because mold cap 40 protrudes vertically downwards in direction −Z into opening 30 rather than vertically upwards in direction Z, the assembly formed from printed circuit 26 and integrated circuit package 32 will have an overall thickness that is less than the thickness associated with mounting a comparably thick integrated circuit package 28 on printed circuit board 26 (i.e., thickness T1 will be less than thickness T2). This creates additional space within electronic device 10 in those portions of device 10 that overlap integrated circuit package 32 such as portion 42.

Figure 3:
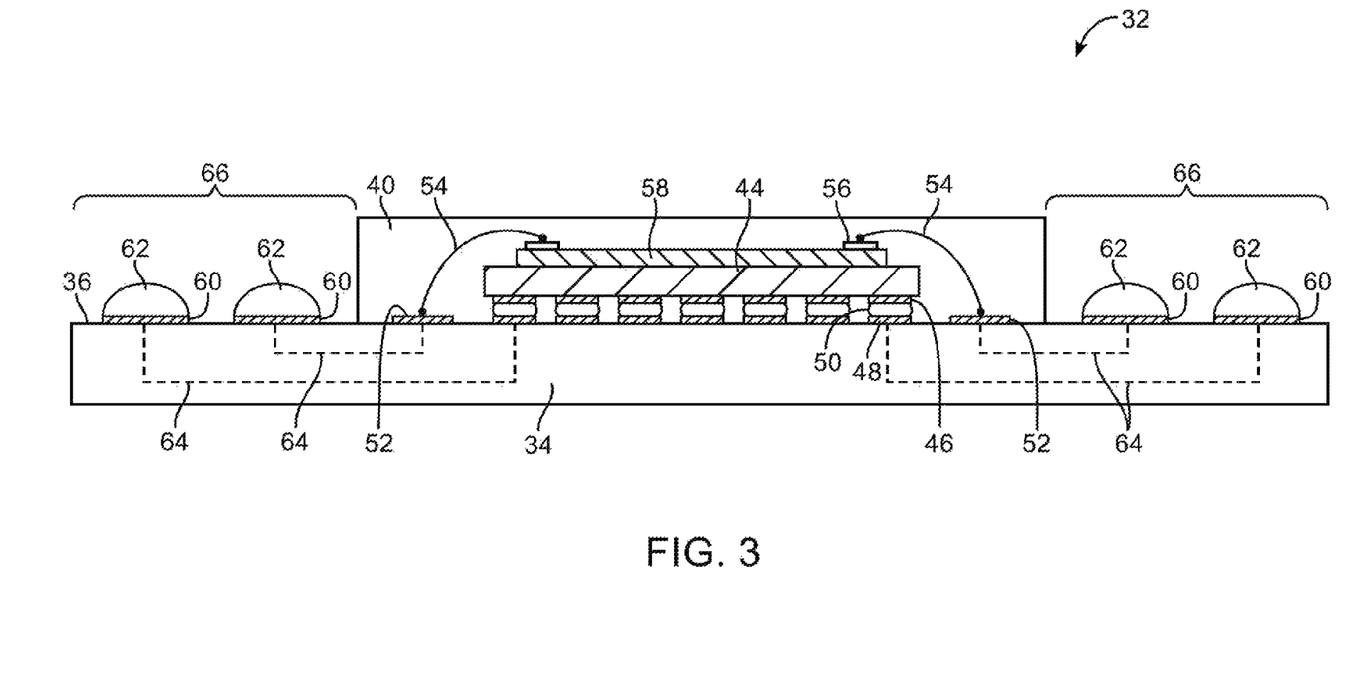
FIG. 3 is a cross-sectional side view of an illustrative integrated circuit package in accordance with an embodiment.

FIG. 3 is a cross-sectional side view of an illustrative integrated circuit package. In the example of FIG. 3, integrated circuit package 32 includes two integrated circuit dies—first die 44 and second die 58. In general, integrated circuit package 32 may include one die, two dies, three dies, or more than three dies. The example of FIG. 3 is merely illustrative.

As shown in FIG. 3, integrated circuit die 44 may have metal solder pads such as contacts 46. Package substrate 34 may have corresponding metal solder pads such as contacts 48 on surface 36. Solder 50 may be used to mount integrated circuit die 44 to surface 36 of package substrate 34 (i.e., die 44 may be flip-chip mounted to the printed circuit forming substrate 34 using a ball grid array or other suitable mounting arrangement). Integrated circuit die 58 may be stacked on top of integrated circuit die 44. For example, die 44 may be a processor or application-specific integrated circuit and die 58 may be a memory chip (as an example). Wire bonds 54 may be used to connect metal pads such as contacts 56 on integrated circuit die 58 to metal pads such as contacts 52 on surface 36 of package substrate 34. Dielectric such as molded plastic may be used to form mold cap 40 (i.e., mold cap 40 may be from plastic that is molded over integrated circuit die 44 and integrated circuit die 58 to environmentally seal dies 44 and 58 and the contacts, solder, and wires used in electrically connecting these dies to package substrate 34).

Package substrate 34 may be formed from a printed circuit board having one or more dielectric layers. Metal traces may form signal paths 64 that interconnect the contacts under mold cap 40 such as contacts 52 and 48 to package substrate contacts in 60 in uncovered peripheral region 66. Peripheral region 66 may form a ring-shaped border that surrounds mold cap 40 or may have other suitable shapes. The center of substrate 32 is a mold cap region that is covered with mold cap 40. Uncovered peripheral region 66 is free of mold cap material, so contacts 60 and the spaces between contacts 60 in region 66 are not covered with any molded plastic material. Solder 62 on contacts 60 in uncovered region(s) 66 is also uncovered by mold cap material, so solder 62 may be used to solder integrated circuit package 32 to printed circuit 26. Mold cap 40 may have a rectangular outline, an L-shaped outline, or other suitable shape. Region 66 may be a rectangular ring-shaped region that surrounds a rectangular mold cap, or may have other shapes surrounding mold cap 40.

Figure 4:
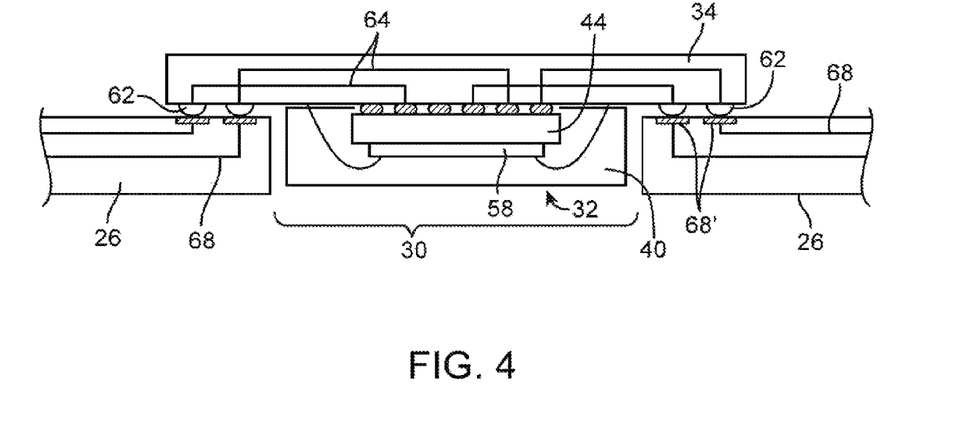
FIG. 4 is a cross-sectional side view of an integrated circuit package of the type shown in FIG. 3 mounted to a printed circuit board so that a die covering structure such as a mold cap on the package protrudes through an opening in the printed circuit board in accordance with an embodiment.

The package configuration of FIG. 3 allows signals to be routed to upper surface 36 of package substrate 34. This allows packaged integrated circuit 32 to be mounted so that mold cap protrudes into opening such as opening 30 of FIG. 2 in printed circuit board 26 and so that upper surface 36 faces printed circuit board 26. A cross-sectional side view of packaged integrated circuit 32 of FIG. 3 following mounting of packaged integrated circuit 32 to printed circuit board 26 in this way is shown in FIG. 4. As shown in FIG. 4, printed circuit 26 may have an opening such as opening 30. Opening 30 may have the shape of mold cap 40. If, for example, mold cap 40 has a rectangular footprint (i.e., a rectangular outline when viewed in vertical dimension Z), opening 30 may have a corresponding rectangular shape. Mold cap 40 may have a thickness that is the same as the thickness of printed circuit 26, may be thinner than printed circuit 26, or may be thicker than printed circuit 26 (i.e., so that a portion of mold cap 40 protrudes out of the opposite side of printed circuit 26 from substrate 34).

Printed circuit 26 may contain multiple layers of printed circuit board material and metal traces for forming printed circuit signal lines 68 and printed circuit board contacts 68' to which contacts 60 of package substrate 34 are soldered using solder 62. Printed circuit signal lines (interconnects) 68 may be used to route signals between integrated circuit package 32 (i.e., integrated circuits in package 32) and external components mounted elsewhere in device 10 (e.g., integrated circuits or other components soldered to printed circuit board contacts 68' or otherwise mounted on printed circuit 26).

Figure 5:
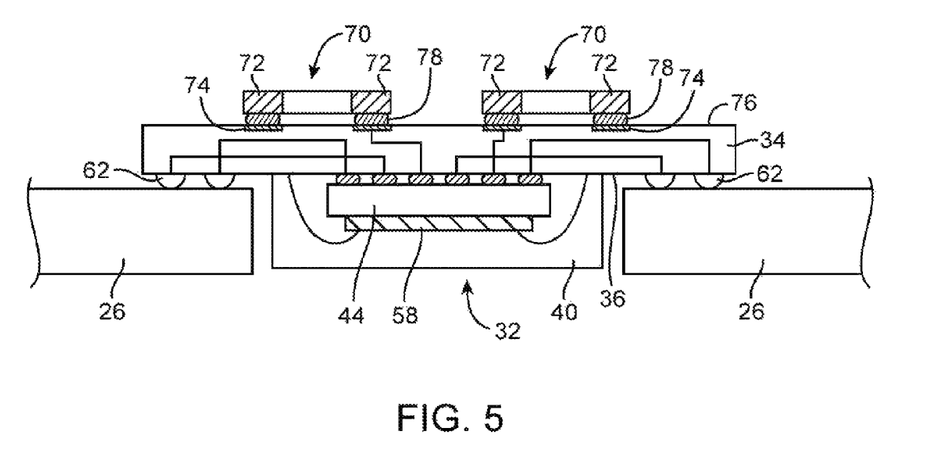
FIG. 5 is a cross-sectional side view of an illustrative integrated circuit package that is mounted to a printed circuit board so that the mold cap on a first side of a package substrate protrudes through an opening in the printed circuit board and that has external components mounted to an opposing second side of the package substrate in accordance with an embodiment.

If desired, additional components may be mounted on integrated circuit package 32 such as components 70 of FIG. 5. Package substrate 34 may have opposing first and second sides. Surface 36 may be formed on the first side of substrate 34, facing printed circuit board 26. Surface 76 may be formed on the opposing second side of substrate 34 (i.e., surfaces 36 and 76 may be opposing surfaces on the front and back of substrate 34). As shown in FIG. 5, components 70 may have contacts such as terminals 72. Terminals 72 may be soldered to mating contacts such as contacts 74 on surface 76 of package substrate 34 using solder 78. Components 70 may be discrete components (e.g., surface-mount technology components such as capacitors, inductors, resistors, etc.), may be packaged integrated circuits, or may be other suitable electronic devices. As an example, components 70 may be direct current (DC) blocking capacitors.

Figure 6:
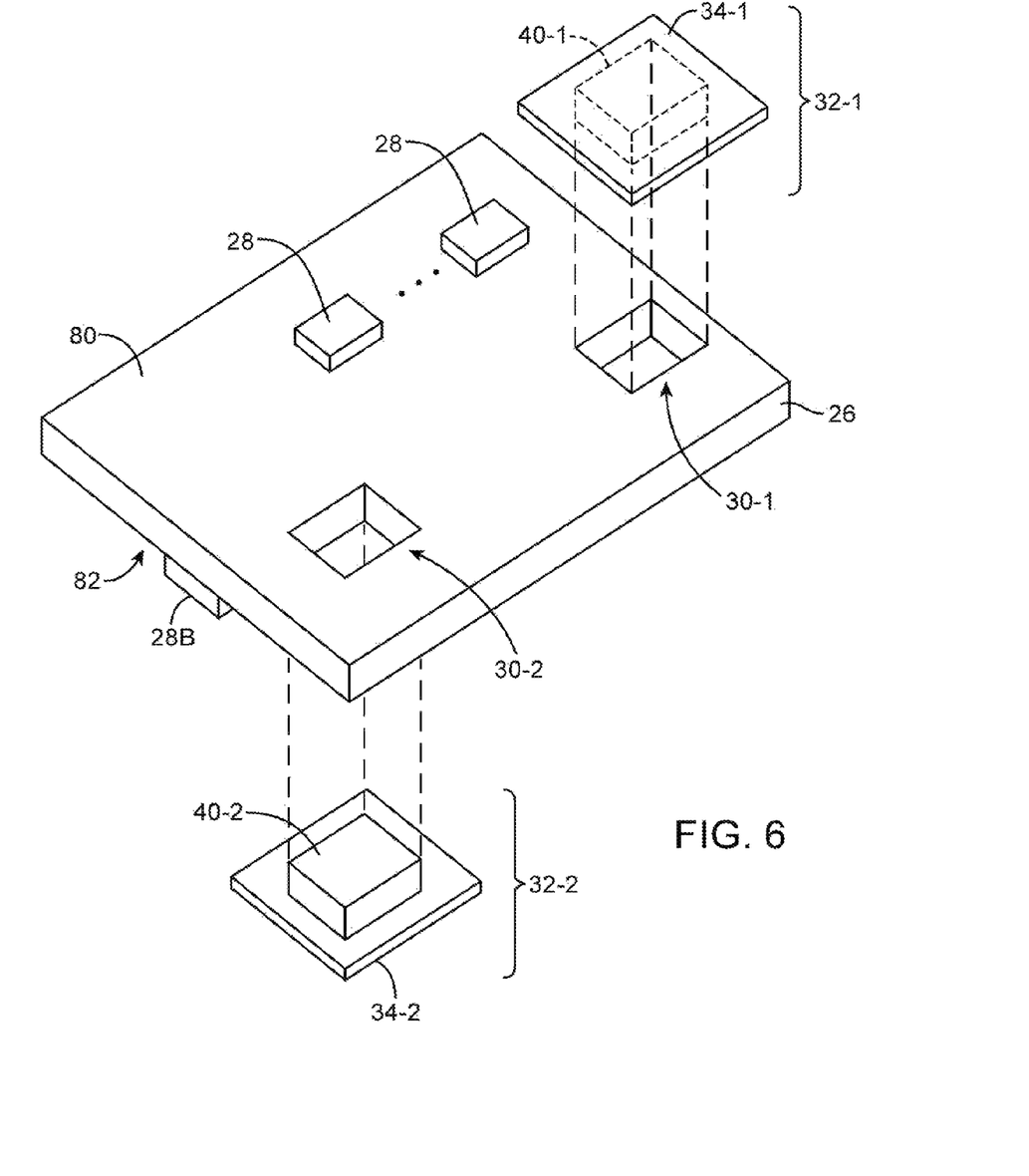
FIG. 6 is a perspective view of an illustrative printed circuit board having openings that receive protruding portions of integrated circuit packages in accordance with an embodiment.

Multiple openings 30 may be formed in printed circuit 26. Integrated circuit packages 32 may be mounted to the upper and lower surfaces of printed circuit 26. An illustrative printed circuit board with multiple openings 30 is shown in FIG. 6. As shown in FIG. 6, printed circuit 26 may have upper surface 80 and opposing lower surface 82. Integrated circuit package 32-1 has a downward-facing mold cap 40-1 that is received within opening 30-1. Package substrate 34-1 of integrated circuit package 32-1 has contacts that are soldered to mating contacts on upper surface 80 of printed circuit. Integrated circuit package 32-2 has upwards-facing mold cap 40-2 that extends into opening 30-2. Package substrate 34-2 of integrated circuit package 32-2 has contacts that are soldered to mating contacts on lower surface 82 of printed circuit 26. Additional components (e.g., packaged integrated circuits 28) may be soldered to upper surface 80 and lower surface 82 (see, e.g., packaged integrated circuit 28B). In the configuration of FIG. 6, two integrated circuit packages 32-1 and 32-2 have been mounted in two respective openings 30-1 and 30-2 of printed circuit board 26. This is merely illustrative. Printed circuit 26 may have any suitable number of openings 30 and any suitable number of integrated circuit packages may be mounted so that their mold cap portions extend into those openings.

Figure 7:
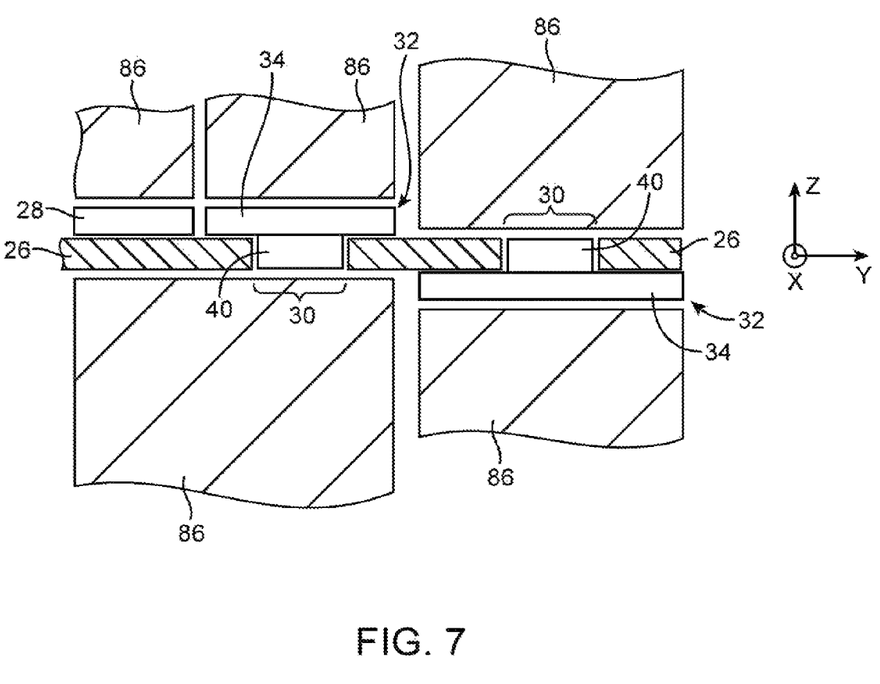
FIG. 7 is a cross-sectional side view of a printed circuit board with openings that receive protruding mold cap portions of packaged integrated circuits in accordance with an embodiment.

As shown in the cross-sectional side view of FIG. 7, the relatively small thicknesses associated with mounting protruding portions of integrated circuit packages 32 within openings 30 creates additional space within the interior of device housing 12 for accommodating internal device structures 86. Internal device structures 86 may include integrated circuits, electrical components such as buttons, light-emitting diodes, sensors, light detectors, printed circuits, internal housing structures, and other internal components in device 10. Packaged integrated circuits 32 occupy a smaller thickness in vertical dimension Z than comparable packaging arrangements for packaged integrated circuits 28 that do not have mold caps extending into printed circuit openings 30. Accordingly, structures 86 that overlap packaged integrated circuits 32 and openings 30 are provided with more vertical space than structures 86 that overlap components 28 on printed circuit 26 of FIG. 7.

Figure 8:
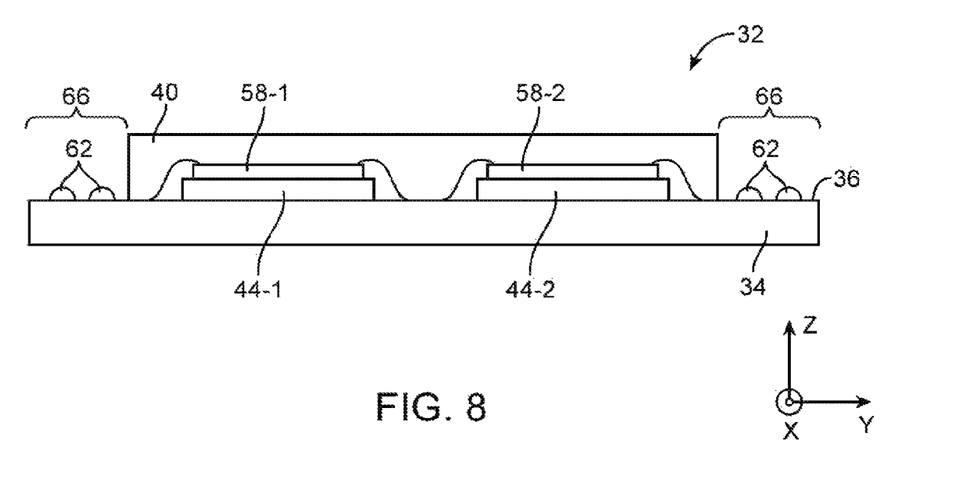
FIG. 8 is a cross-sectional side view of an illustrative integrated circuit package in which multiple side-by-side integrated circuit die are mounted to a package substrate in accordance with an embodiment.

If desired, multiple laterally adjacent integrated circuit dies may be mounted (soldered) to package substrate 34. As shown in FIG. 8, for example, integrated circuit package 32 may contain first integrated circuit die 44-1 that is flip-chip mounted (i.e., mounted using a ball grid array arrangement) onto package substrate 34 and may contain a second integrated circuit die 44-2 that is also flip-chip mounted onto substrate 34. Die 44-1 and die 44-2 may be mounted to surface 36 of substrate 34 at respective laterally adjacent locations (i.e., at different respective locations in lateral dimensions X and Y of FIG. 8), so that die 44-1 is next to die 44-2. Optional additional die may be stacked on top of die 44-1 (see, e.g., die 58-1) and/or on top of die 44-2 (see, e.g., die 58-2). There are two laterally adjacent dies and two corresponding stacked dies in the example of FIG. 8 all of which are covered by a common mold cap 40, while leaving border regions 66 free of any mold cap material. If desired, three or more dies may be arranged at laterally adjacent positions on package substrate 34 and may be covered by a common mold cap 40. Mold cap 40 may, if desired, be segmented so that there are two or more mold cap portions on surface 36 of substrate 34 and so that each of these separate mold caps overlaps one or more respective dies. The configuration of FIG. 8 is merely illustrative.

Figure 9:
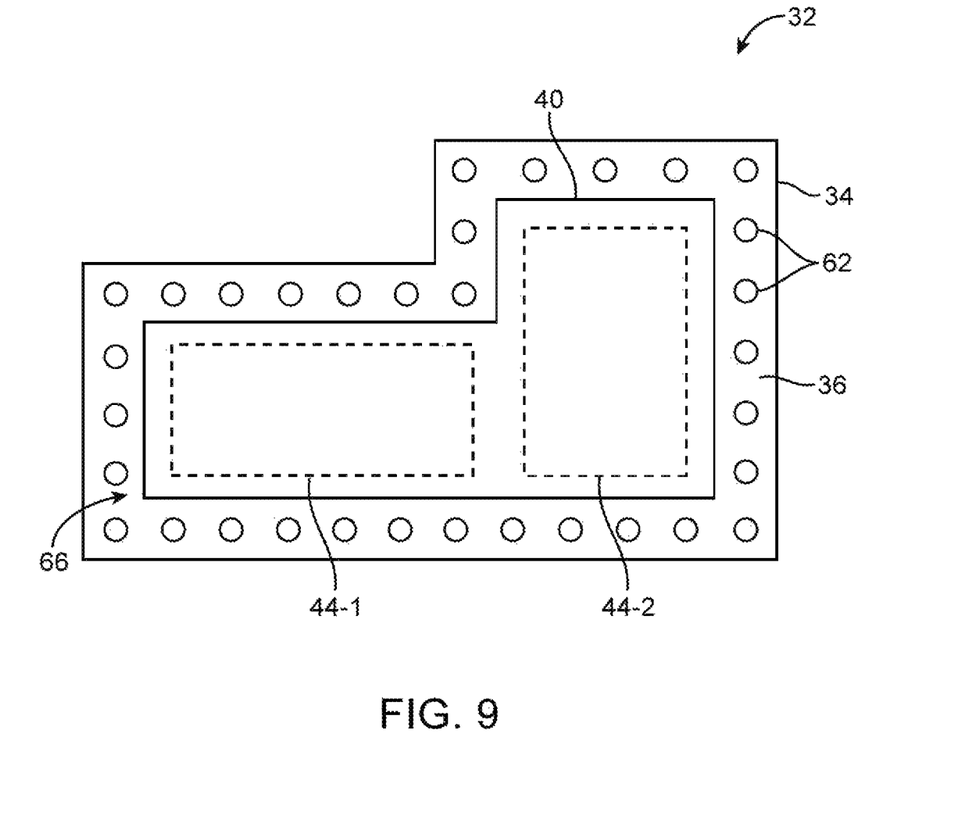
FIG. 9 is a top view of an illustrative integrated circuit package in which multiple laterally adjacent integrated circuit die are mounted in an L shape to a package substrate in accordance with an embodiment.

FIG. 9 is a top view of an illustrative configuration for integrated circuit package 32 in which dies 44-1 and 44-2 are arranged to form a lateral bend (i.e., a non-rectangular L-shape). Other non-rectangular layouts may be used for the integrated circuit die(s) on package substrate 34, if desired. Mold cap 40 may have a shape that covers the integrated circuit dies on substrate 34. In the example of FIG. 9, die 44-1 and die 44-2 form a non-rectangular L shape, so mold cap 40 has a corresponding non-rectangular L shape and mold-cap-free border region 66 has a shape that surrounds the L-shaped outline of the mold cap. In configurations in which the integrated circuit dies are arranged differently on surface 36 of package substrate 34, mold cap 40 can be implemented with correspondingly different shapes. To mount integrated circuit package 32 on printed circuit 34 so that mold cap 40 extends through opening 30, opening 30 may be provided with a shape that matches that of mold cap 40. If, for example, mold cap 40 has a non-rectangular shape such as an L shape, opening 30 may be provided with a corresponding non-rectangular shape such as an L shape.

The foregoing is merely illustrative and various modifications can be made by those skilled in the art without departing from the scope and spirit of the described embodi-

What is claimed is:

1. Apparatus, comprising:
a printed circuit board having first and second opposing surfaces and first and second separate, laterally adjacent openings that extend from the first surface to the second surface;
a first integrated circuit package including a first package substrate that is soldered to the first surface of the printed circuit board, a first integrated circuit die mounted on a surface the first package substrate, and a first mold cap that covers the first integrated circuit die and that extends into the first opening, the first mold cap having a non-rectangular perimeter with at least five sides, and the surface of the first package substrate having a region that is covered by the first mold cap and having a non-rectangular uncovered border region that surrounds the non-rectangular perimeter of the mold cap and that is uncovered by the first mold cap; and
a second integrated circuit package including a second package substrate that is soldered to the second surface of the printed circuit board, a second integrated circuit die mounted on the second package substrate, and a second mold cap that covers the second integrated circuit die and that extends into the second opening.

2. The apparatus defined in claim 1 wherein the first integrated circuit die has first contacts, wherein the first package substrate has a surface with mating second contacts, and wherein solder is used to solder the first contacts to the second contacts.

3. The apparatus defined in claim 1 further comprising another integrated circuit die that is mounted on the first package substrate laterally adjacent to the first integrated circuit die.

4. The apparatus defined in claim 2 further comprising an additional integrated circuit die stacked with the first integrated circuit die under the first mold cap.

5. The apparatus defined in claim 2 wherein the printed circuit board has printed circuit board contacts, wherein the first integrated circuit package has package substrate contacts on the first package substrate, and wherein the printed circuit board contacts are soldered to the integrated circuit package contacts.

6. The apparatus defined in claim 4 further comprising wire bonds that connect the additional integrated circuit die to pads on the surface.

7. The apparatus defined in claim 5 wherein the package substrate contacts are formed in the non-rectangular uncovered border region.

8. The apparatus defined in claim 7 wherein the package substrate contacts comprise metal pads on the surface, the apparatus further comprising components mounted on an opposing surface of the first package substrate.

9. An apparatus, comprising:
a printed circuit having an opening; and
an integrated circuit package having a package substrate with a surface and an integrated circuit die that is soldered to first contacts on the surface, wherein the integrated circuit package has second contacts on the surface, wherein the surface has a non-rectangular region defined by a perimeter having at least five sides and that has covering material that covers the integrated circuit die and the first contacts, wherein the surface has a non-rectangular uncovered border region that surrounds the perimeter of the non-rectangular region and that is free of covering material, wherein the second contacts are in the non-rectangular uncovered border region, and wherein the integrated circuit package is mounted to the printed circuit with the surface of the package substrate facing the printed circuit and with the covering material protruding into the opening.

10. The apparatus defined in claim 9 wherein the printed circuit comprises a rigid printed circuit board with printed circuit board contacts and wherein the second contacts are soldered to the printed circuit board contacts.

11. The apparatus defined in claim 9 wherein non-rectangular region is L-shaped, and wherein the perimeter of the L-shaped non-rectangular region has six sides.

12. The apparatus defined in claim 9 wherein the second contacts in the non-rectangular uncovered border region are formed along each of the at least five sides of the perimeter of the non-rectangular region.

13. The apparatus defined in claim 10 wherein the covering material comprises a plastic mold cap.

14. The apparatus defined in claim 13 further comprising an additional integrated circuit die that is covered by the plastic mold cap.

15. The apparatus defined in claim 14 wherein the additional integrated circuit die is stacked on the integrated circuit die and is wire bonded to the package substrate and wherein the package substrate comprises multiple dielectric layers and metal traces.

16. The apparatus defined in claim 14 wherein the additional integrated circuit die is soldered to the package substrate at a location that is laterally adjacent to the integrated circuit die.

17. The apparatus defined in claim 14 wherein the package substrate has opposing first and second sides, wherein the surface is located on the first side, and wherein the apparatus further comprises electrical components soldered to the second side of the package substrate.

18. Apparatus, comprising:
a printed circuit board having first and second opposing surfaces and first and second separate, laterally adjacent openings that extend from the first surface to the second surface;
a first integrated circuit package including a first package substrate that is soldered to the first surface of the printed circuit board, a first integrated circuit die mounted on the first package substrate, and a first mold cap that covers the first integrated circuit die and that extends into the first opening;
a second integrated circuit package including a second package substrate that is soldered to the first surface of the printed circuit board, a second integrated circuit die mounted on the second package substrate, and a second mold cap that covers the second integrated circuit die and that extends into the second opening;
an electronic device housing in which the printed circuit board, the first integrated circuit package, and the second integrated circuit package are mounted;
a first electrical component mounted within the housing; and
a second electrical component mounted within the housing, wherein the first integrated circuit package is interposed between the first and second electrical components.

19. The apparatus defined in claim 18 wherein the first opening and a portion of the printed circuit board are interposed between the first and second electrical components.

20. The apparatus defined in claim 18 wherein the first integrated circuit die is mounted on a surface of the first package substrate, wherein the surface of the first package substrate has a non-rectangular region defined by a perimeter having at least five sides that is covered by the first mold cap, and wherein the surface of the first package substrate has a non-rectangular uncovered border region that surrounds the perimeter of the non-rectangular region and that is uncovered by the first mold cap.

21. The apparatus defined in claim 19 wherein the first and second opposing surfaces of the printed circuit board are interposed between the first and second electrical components.

* * * * *